United States Patent [19]

Vermeersch et al.

[11] Patent Number: 5,543,261
[45] Date of Patent: Aug. 6, 1996

[54] STORAGE STABILITY OF A DIAZO-BASED IMAGING ELEMENT FOR MAKING A PRINTING PLATE

[75] Inventors: Joan Vermeersch, Deinze; Guido Hauquier, Nijlen; Dirk Kokkelenberg, St. Niklaas, all of Belgium

[73] Assignee: AGFA-Gevaert, N.V., Mortsel, Belgium

[21] Appl. No.: 267,508

[22] Filed: Jun. 29, 1994

[30] Foreign Application Priority Data

Jul. 2, 1993 [EP] European Pat. Off. ............. 93201934

[51] Int. Cl.$^6$ ............................. G03F 7/11; G03F 7/016; G03F 7/021
[52] U.S. Cl. ..................... 430/159; 430/160; 430/161; 430/272.1; 430/278.1; 430/302
[58] Field of Search ................... 430/159, 160, 430/302, 272, 278, 162, 161

[56] References Cited

U.S. PATENT DOCUMENTS

| | | | |
|---|---|---|---|
| 3,971,660 | 7/1976 | Staehle | 430/302 |
| 4,284,705 | 8/1981 | Phlipot et al. | 430/159 |
| 4,483,913 | 11/1984 | Eklund et al. | 430/160 |
| 4,745,042 | 5/1988 | Sasago et al. | 430/156 |
| 5,047,309 | 9/1991 | Koike et al. | 430/175 |
| 5,272,036 | 12/1993 | Tani et al. | 430/158 |

*Primary Examiner*—John S. Y. Chu
*Attorney, Agent, or Firm*—Breiner & Breiner

[57] ABSTRACT

The present invention provides an imaging element comprising on a hydrophilic support a light sensitive layer containing a diazo resin or a diazonium salt characterized in that said light sensitive layer contains pullulan. The obtained imaging element shows an improved storage stability.

4 Claims, No Drawings

STORAGE STABILITY OF A DIAZO-BASED IMAGING ELEMENT FOR MAKING A PRINTING PLATE

DESCRIPTION

1. Field of the Invention

The present invention relates to a diazo sensitized imaging element which is developable by plain water to a lithographic printing plate.

2. Background of the Invention

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers.

Particularly diazo-sensitized systems are widely used. These systems have been extensively reviewed by Kosar J. in "Light-Sensitive Systems", Wiley, N.Y., 1965, Chapter 7. A generally used negative-working diazo-sensitized system is based on the capability of diazo compounds to harden a polymer when exposed to ultraviolet and blue radiation. Diazo compounds which have been used for the preparation of lithographic printing plates based on their hardening properties are e.g. diazonium salts whose photolysis products can harden polymers (natural colloids or synthetic resins) directly and diazonium polymers. Although polymers containing diazonium groups have a large structure they remain water soluble owing to the presence of the ionic diazonium groups. When these groups are destroyed by exposure to light an insoluble resin is formed. Particularly useful diazonium polymers are the condensation products of a carbonyl compound, e.g. an aldehyde, such as formaldehyde, with a diazonium salt of e.g. a p-aminodiphenylamine. These condensation products are usually designated diazo resins. In these systems a polymeric binder is optionally added to the diazo resin coating.

Several types of supports can be used for the manufacturing of a diazo-sensitized lithographic printing plate. Common supports are metal supports like Al or Zn, polyester film supports and paper bases. These supports, if not sufficient hydrophilic by themselves, are first coated with a hydrophilic layer to form the hydrophilic background of the printing plate and a top layer containing the diazo compound is then applied (see for example DE-P-1900469, DE-P-2030634 and U.S. Pat. No. 3,971,660).

It is known to use as hydrophilic layer in these systems a layer containing polyvinyl alcohol and hydrolyzed tetraethyl orthosilicate and preferably also silicium dioxide and/or titanium dioxide as described in e.g. GB-P-1419512, FR-P-2300354, U.S. Pat. No. 3,971,660 and 4284705. This hydrophilic layer is overcoated with a light-sensitive layer containing a diazonium salt or a diazo resin in a polymeric binder.

Upon image-wise exposure of the light-sensitive layer the exposed image areas become water insoluble and the unexposed areas remain water soluble. The plate is then developed with water to remove the diazonium salt or diazo resin in the unexposed areas. Such development may take place by means of plain water as disclosed in e.g. EP-A-450199 and EP92203835.1.

It has however been found that the lithographic properties of a lithographic printing plate obtained from diazo based imaging elements in particular as disclosed in e.g. EP-A-450199, EP92203835.1 and U.S. Pat. No. 3,971,660 decrease upon storage of the imaging element.

3. Summary of the invention.

It is an object of the present invention to provide a diazo based imaging element for producing a lithographic printing plate having an improved storage stability.

Other objects will become apparent from the description hereinafter.

According to the present invention an imaging element comprising on a hydrophilic support a light sensitive layer containing a diazo resin or a diazonium salt characterized in that said light sensitive layer contains pullulan.

According to the present invention there is provided a method for obtaining a lithographic printing plate comprising the steps of image-wise exposing an imaging element as defined above and subsequently removing the light sensitive layer in the non-exposed or insufficiently exposed areas of said imaging element by means of rinsing or washing said imaging element preferably with plain water.

4. Detailed description

It has been found that the storage stability of a diazo based imaging element can be improved by using in the light sensitive layer pullulan. As a consequence, the lithographic properties such as printing endurance, ink acceptance by the printing areas and ink repellance by the non-printing areas remain much more stable upon storage of the imaging element before imaging.

Pullulan is a polysaccharide that is produced by microorganisms of the Aureobasidium pullulans type (Pullularia pullulans) and that contains maltotriose repeating units connected by a α-1,6 glycosidic bond. Pullulan is generally produced on industrial scale by fermentation of partially hydrolyzed starch or by bacterial fermentation of sucrose. Pullulan is commmercially available from e.g. Shodex, Pharmacosmos.

Preferably the light sensitive layer further includes a cationic fluor containing surfactant, preferably a perfluorinated surfactant and more preferably a perfluorinated ammonium surfactant. Typical examples of perfluorinated ammonium surfactants are:

n.$C_8F_{17}SO_2NH$—$(CH_2)_3N^+(CH_3)_3I^-$(Fluorad FC 135 from 3M)

n.$C_9F_{19}SO_2NH$—$(CH_2)_4N^+(CH_3)_3Br^-$ n.$C_7F_{15}CONH$—$(CH_2)_3N^+(CH_3)_3I^-$ (n.$C_8F_{17}COO$—$(CH_2)_4)_2N^+(CH_3)_2I^-$

Examples of low-molecular weight diazonium salt-for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

Examples of diazo resins useful in the present invention include condensation products of an aromatic diazonium salt as the light-sensitive substance. Such condensation products are known and are described, for example, in German Pat. no. 1214086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium.

The light sensitive layer according to the present invention preferably also contains dispersed water-insoluble polymers. Said aqueous dispersion of water insoluble polymer is preferably cationic or nonionic either e.g. as a result of an emulsifier or by having the cationic or nonionic group linked to the polymer. The water insoluble polymer is preferably a solid particulate having a size in the range of about 100 Angstroms to 1 micron in diameter and does not form a film below 30° C. In general, any polymer which carries a cationic or nonionic group or which can be formulated into an emulsion using a cationic or nonionic emulsifier can be employed in the present invention. Suitable polymers include homopolymers and copolymers of styrene, methylacrylate, ethylacrylate, butylacrylate, methylmethacrylate, ethylmethacrylate, butyl methacrylate, vinyl acetate, vinyl chloride, vinylidene chloride, butadiene, methyl styrene, vinyl toluene, dimethylaminoethyl acrylate, acrylic acid, methacrylic acid, isoprene, chloroprene, maleic anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

Among the cationic and nonionic emulsifiers which can be used in the present invention are: ammonium salts of substituted amines containing alkyl and/or aryl groups attached to the nitrogen, alkyl or aryl sulfonium salts, alkyl and alkyl-aryl polyethers, cationic or nonionic fluorosurfactants and polyols.

The thickness of the light-sensitive layer in the material of this invention may vary in the range of 0.1 to 10 um and is preferably between 0.5 and 2.5 um.

Hydrophilic supports for use in connection with the present invention are supports having a hydrophilic surface e.g. a toughened and anodized aluminum support or supports that are rendered hydrophilic by means of a hydrophilic layer provided on at least one surface of the support.

Supports that can be provided with a hydrophilic layer are e.g. photographic film bases e.g. substrated polyethylene terephthalate film, cellulose acetate film, plastics having a metal layer or deposit thereon, a metal support, e.g. aluminum and polyolefin (e.g. polyethylene) coated paper, the polyolefin surface of which may have been subjected to a corona discharge to improve the adherence of a hydrophilic layer.

As hydrophilic (co)polymers in said hydrophilic layer one may use, for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is the same as or higher than the hydrophilicity of polyvinyl acetate hydrolyzed to at least an extent of 60 percent by weight, preferably 80 percent by weight.

Examples of hydrolyzed tetraalkyl orthosilicate crosslinking agents are hydrolyzed tetraethyl orthosilicate and hydrolyzed tetramethyl orthosilicate.

The amount of tetraalkyl orthosilicate crosslinking agent is preferably at least 0.2 parts by weight per part by weight of hydrophilic (co)polymer, more preferably between 0.5 and 5 parts by weight, most preferably between 1.0 parts by weight and 3 parts by weight.

Said hydrophilic layer in an imaging element used in accordance with the present invention preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the layer is given a uniform rough texture consisting of microscopic hills and valleys, which serve as storage places for water in background areas.

The thickness of a hydrophilic layer in a material according to this invention may vary in the range of 0.2 to 25 um and is preferably 1 to 10 um.

According to a preferred embodiment in connection with the present invention there is provided an intermediate layer of an organic compound having cationic groups between the hydrophilic and light sensitive layer. As a consequence the development by plain water of such a diazo based imaging element is improved.

Organic compounds having cationic groups for use in an intermediate layer are preferably hydrophilic and may be low molecular weight compounds but are preferably polymers. Preferred compounds are those having one or more ammonium groups or amino groups that can be converted to ammonium groups in an acidic medium. An especially preferred type of cationic compounds are polysaccharides modified with one or more groups containing an ammonium or amino group.

Most preferred organic compounds having cationic groups are dextrans or pullulan wherein at least some of the hydroxy groups of the dextran or pullulan has been modified into one or more of the following groups:

—O—R$^1$

—O—CO—R$^2$ wherein R$^1$ represents an organic residue containing an amino or ammonium group, e.g. an amine substituted alkyl, an amine substituted alkylaryl etc.. R$^2$ has one of the significances given for R$^1$ or stands for —OR$^3$ or —N(R$^4$)R$^5$, wherein R$^3$ has one of the significances given for R$^1$ and each of R$^4$ and R$^5$ which may be the same or different have one of the significances given for R$^1$.

Examples of dextrans or pullulan that can be used in accordance with the present invention are dextrans or pullulan wherein some of the hydroxyl groups have been modified in one of the groups shown in table 1.

TABLE 1

| no. | modified group |
|---|---|
| 1 | —O—CH$_2$—CH$_2$—NH$_2$ |
| 2 | —O—CO—NH—CH$_2$—CH$_2$—NH$_2$ |
| 3 | —O—CO—NH—CH$_2$—CH$_2$—N(CH$_2$—CH$_2$—NH$_2$)$_2$ |
| 4 | —O—CH$_2$—CH$_2$—NH—CH$_2$—CH$_2$—NH$_2$ |
| 5 | —O—CH$_2$—CH$_2$—NH—CH$_2$—CHOH—CH$_2$—N$^+$ (CH$_3$)$_3$ Cl$^-$ |
| 6 | —O—(CH$_2$—CH$_2$—O)$_n$—CH$_2$—CH$_2$—NH$_2$<br>wherein n represents an integer from 1 to 50 |
| 7 | —O—CO—NH—CH$_2$—CH$_2$—NH—CH$_2$—CHOH—CH$_2$—N$^+$ (CH$_3$)$_3$ Cl$^-$ |
| 8 | —O—CH$_2$—CH$_2$—N(CH$_2$—CH$_3$)$_2$.HCl |
| 9 | —O—CH$_2$—CH$_2$—N(CH$_2$—CH$_2$—NH$_2$)$_2$ |
| 10 | —O—CONH—CH$_2$—CH$_2$—N(CH$_2$—CH$_2$—NH$_2$)$_2$ |
| 11 | —O—CONH—(CH$_2$—CH$_2$—O)$_n$—CH$_2$—CH$_2$—NH$_2$ |

The modified dextrans or pullulan can be prepared by a reaction of a dextran with e.g. alkylating agents, chloroformates, acid halides, carboxylic acids etc. . .

An intermediate layer containing the organic compound having one or more cationic groups is preferably provided in an amount of 5 to 500mg/m$^2$ and more preferably in an amount of 10 to 200mg/m$^2$.

The imaging element in connection with the present invention advantageously contains water-soluble dyes such as rhodamines, sudan blue, methylen blue, eosin or triphenylmethane dyes such as crystal violet, victoria pure blue, malachite green, methylviolet and fuchsin or dye pigments. These colorants may be incorporated in the light sensitive layer and/or hardened hydrophilic layer.

To obtain a lithographic printing plate from an imaging element according to the invention said imaging element is image-wise exposed and subsequently rinsed or washed with plain water to remove diazo resin or diazonium salts in the non-exposed or insufficiently exposed parts of the imaging element.

The exposure of the imaging element used in the present invention advantageously proceeds with ultraviolet light optionally in combination with blue light in the wavelength range of 250 to 500 nm. Useful exposure sources are high or medium pressure halogen mercury vapor lamps, e.g. of 1000 W. Since most lithography is done by the offset process, the imaging element is preferably exposed in such a way that the image obtained thereon is right reading. The exposure may be an exposure using optics or a contact exposure.

The diazo resin or diazonium salts are converted upon exposure from water soluble to water insoluble (due to the destruction of the diazonium groups) and additionally the photolysis products of the diazo may induce an advancement in the level of crosslinking of the polymeric binder or diazo resin, thereby selectively converting the surface, in an image pattern, from water soluble to water insoluble. The unexposed areas remain unchanged, i.e. water soluble.

The following examples illustrate the present invention without being limited thereto. The percentages given are by weight unless otherwise stated.

EXAMPLE

Preparation of a lithographic base

To 440 g of a dispersion contg. 21.5% TiO$^2$ (average particle size 0.3 to 0.5 um) and 2.5% polyvinyl alcohol in deionized water were subsequently added, while stirring, 250 g of a 5% polyvinyl alcohol solution in water, 105 g of a hydrolyzed 22% tetramethylorthosilicate emulsion in water and 12 g of a 10% solution of a wetting agent. To this mixture was added 193 g of deionized water and the pH was adjusted to pH=4.

The obtained dispersion was coated on a polyethyleneterephthalate film support (coated with a hydrophilic adhesion layer) to a wet coating thickness of 50 g/m$^2$, dried at 30° C. and subsequently hardened by subjecting it to a temperature of 57° C. for 1 week.

To this base was further provided an aqueous solution of (pH=5) of Dormacid (a dextran modified with a diethylaminoehty group available from Pfeifer & Langen) and a cationic wetting agent to a dry coating thickness of 100 mg Dormacid per m$^2$.

The obtained element was then heated for 1 week at 57° C.

Preparation of the imaging elements

An imaging element according to the invention was produced by preparing the following light sensitive composition and coating it to the above described lithographic base in an amount of 35g/m$^2$ (wet coating amount) and drying it at 30° C.

Preparation of the light sensitive coating:

To 63g of a 20% dispersion of polymethylmethacrylate (particle diameter of 60 nm) stabilized with cetgltrimethylammonium bromide in deionized water was subsequently added, while stirring, 120 g of a 5% solution of PULLULAN PF20 (obtained from Hayashibara Co) in water and 15 g of a 10% dispersion of heligen blue (BASF) in water. 66 g of a 15% solution of the condensation/product of diphenylamine diazonium salt and formaldehyde in water was then slowly added. Finally 10 g of a 5% solution of non-ionic fluor containing surfactant (C$_{17}$F$_{15}$CONH(CH$_2$—CH$_2$O)$_{17}$—H) in water, and 746 ml of water were added.

A comparative imaging element was prepared similar to the above described imaging element but with the exception that instead of PULLULAN PF20 a polyvinylacetate hydrolyzed to an extent of 98% and having a weight average molecular weight of 90 000 g/mol (POLYVIOL W48/20 available from Wacker) was used in the light sensitive layer.

Each of the above described imaging elements were stored for 48 hours at 57° C. They were then exposed through a mask to a high pressure halogen mercury vapor lamp of 1000W at a distance of 70 cm for 90s.

Subsequently the imaging elements were developed by rinsing with plain water and used to print on an offset press running with a commonly employed ink and fountain solution.

The printing plate obtained with the imaging element according to the invention yielded 10000 copies of excellent quality without ink acceptance in the non-image areas whereas the comparative only yielded 250 copies of acceptable quality because of ink acceptance in the non-image areas.

We claim:

1. An imaging element comprising on a hydrophilic support a light sensitive layer containing a diazo resin or a diazonium salt characterized in that said light sensitive layer contains pullulan wherein said hydrophilic support comprises a hydrophilic layer containing a hydrophilic (co)polymer or (co)polymer mixture and having been hardened with a hydrolyzed tetraalkyl orthosilicate.

2. An imaging element according to claim 1 further comprising an intermediate layer between said hydrophilic layer and said light sensitive layer, said intermediate layer containing an organic compound having cationic groups.

3. An imaging element according to claim 1 wherein said light sensitive layer further contains a fluor containing surfactant.

4. An imaging element according to claim 3 wherein said fluor-containing surfactant is a perfluorinated ammonium surfactant.

* * * * *